United States Patent [19]

Fukushima

[11] Patent Number: 4,466,012

[45] Date of Patent: Aug. 14, 1984

[54] SEMICONDUCTOR DEVICE WITH DEEP OXIDE ISOLATION

[75] Inventor: Toshitaka Fukushima, Yokohama, Japan

[73] Assignee: Fujitsu Limited, Kawasaki, Japan

[21] Appl. No.: 392,348

[22] Filed: Jun. 25, 1982

[30] Foreign Application Priority Data

Jun. 26, 1981 [JP] Japan .................................. 56-98378

[51] Int. Cl.³ ..................... H01L 27/12; H01L 27/04; H01L 29/34; H01L 29/06
[52] U.S. Cl. ........................................ 357/49; 357/50; 357/52; 357/55
[58] Field of Search ...................... 357/49, 50, 55, 52

[56] References Cited

U.S. PATENT DOCUMENTS

| 3,575,740 | 4/1971 | Castrucci et al. | 357/49 |
| 4,255,207 | 3/1981 | Nicolay et al. | 357/50 |
| 4,269,636 | 5/1981 | Rivoli et al. | 357/50 |
| 4,320,411 | 3/1982 | Fukushima | 357/50 |
| 4,375,645 | 3/1983 | Funatsu | 357/50 |

FOREIGN PATENT DOCUMENTS 55-28218 7/1980 Japan .

Primary Examiner—Martin H. Edlow
Assistant Examiner—Jerome Jackson
Attorney, Agent, or Firm—Staas & Halsey

[57] ABSTRACT

A semiconductor device includes therein a plurality of semiconductor elements. First passive isolation regions are formed along the buried layer and second passive isolation regions are formed perpendicularly along the buried layer, enclosing each of the semiconductor elements, additional passive isolation regions are provided at the end portions of the second passive isolation regions wherever the first and second passive isolation regions merge. The additional passive isolation regions are deeper than the second passive isolation regions.

12 Claims, 12 Drawing Figures

SEMICONDUCTOR DEVICE WITH DEEP OXIDE ISOLATION

BACKGROUND OF THE INVENTION

1. Field of the Invention

The present invention relates to a semiconductor device, more particularly to a semiconductor device in which the so-called latchup phenomena can be prevented.

2. Prior Art

As is well known, "latchup" refers to the formation of parasitic thyristors between the many transistor elements formed on a single semiconductor substrate. The turning on of such parasitic thyristors by, for example, noise near them prevents the transistor elements from functioning as desired and, thus, leads to erroneous operation in the semiconductor device. Generally, the higher the density and number of the transistor elements, the more prominent the occurrence of latchup. Latchup is therefore an especially serious problem in high integration semiconductor devices such as memory devices.

In prior art memory units, one technique for suppressing latchup when increasing the integration has been to form deep, passive isolation regions along the word lines. However, to increase the integration of such memory devices, it is also necessary to reduce the pitch with which the bit lines are arranged. This results in increased latchup between the transistor elements formed along adjacent bit lines. This also results in insufficient withstand voltage between adjacent bit lines.

The inventor has proposed, in Japanese Published Examined Patent Application No. 55-28218 (Japanese Pat. No. 1038742), to suppress latchup and increase the withstand voltage by the formation of additional shallow, passive isolation regions extending in a direction perpendicular to the direction of the above-mentioned deep passive isolation regions, thereby enclosing each transistor element. The reason for the shallowness of the additional regions is that the formation of deep regions would end up separating belts of so-called buried layers with highly dense impurities formed along the word lines into a plurality of divisions. In other words, this would cancel the principal purpose of the buried layers, that is, the reduction of the resistance along the word lines.

Use of shallow passive isolation regions would seemingly solve the problems of latchup and withstand voltage. In fact, however, there are often cases where latchup is not completely suppressed. The reason for this is believed to be that the pairs of deep passive isolation regions and the pairs of shallow passive regions may not completely enclose the transistor elements along their four sides.

SUMMARY OF THE INVENTION

Therefore, it is an object of the present invention to provide a semiconductor device in which latchup can be completely prevented.

The above object is attained by a semiconductor device including therein a plurality of semiconductor elements, wherein first passive isolation regions are formed along the buried layer and second passive isolation regions are formed perpendicularly thereto enclosing each of the semiconductor elements. Additional passive isolation regions are provided wherever the first and second passive isolation regions merge.

BRIEF DESCRIPTION OF THE DRAWINGS

The present invention will be more apparent from the ensuing description with reference to the accompanying drawings wherein.

DESCRIPTION OF THE PREFERRED EMBODIMENT

Figure 1A:
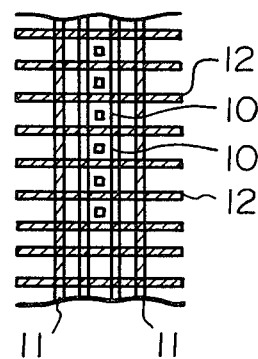
FIG. 1A is a partial plan view showing, in brief, a semiconductor device disclosed in Japanese Published Examined Patent Application No. 55-28218 (1980)

FIG. 1A is a partial plan view of a semiconductor device disclosed in Japanese Published Examined Patent Application No. 55-28218 (1980). In FIG. 1A, reference numeral 10 represents a semiconductor element, for example, a transistor element. A plurality of semiconductor elements 10 are arranged in a line. A plurality of identical lines of semiconductor elements 10 (not shown) are arranged in parallel with each other.

Adjacent lines of semiconductor elements 10 are isolated from each other by first V-shaped passive isolation grooves 11, that is, column grooves. Adjacent semiconductor elements 10 are isolated from each other by second V-shaped passive isolation grooves 12, that is, row grooves.

Figure 1B:
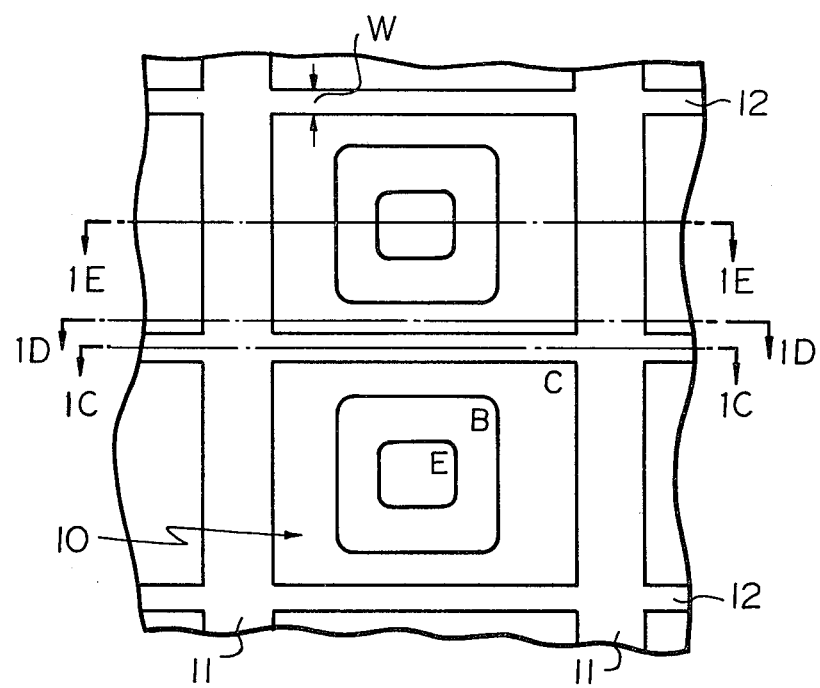
FIG. 1B is an enlarged partial plan view of the semiconductor device shown in FIG. 1A.

FIG. 1B is an enlarged partial plan view of the semiconductor device shown in FIG. 1A. In FIG. 1B, members 10, 11, and 12 are identical to those in FIG. 1A. In the semiconductor element 10, reference symbols E, B, and C denote an emitter, a base, and a collector, respectively.

A look at the partial plan view in FIGS. 1A and 1B, would seemingly show perfect isolation between the semiconductor elements 10 and, accordingly, no possibility of latchup.

Figure 1C:
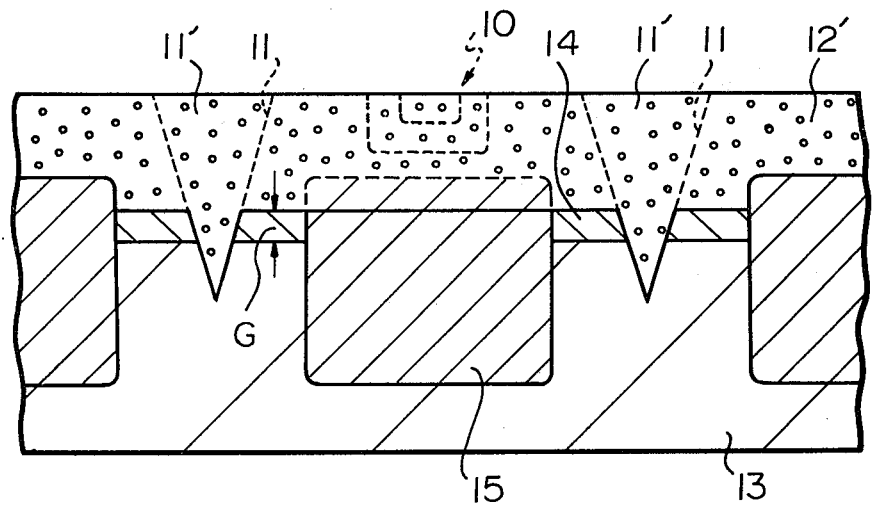
FIGS. 1C, 1D and 1E are cross-sectional views respectively taken along the lines 1C—1C, 1D—1D, and 1E—1E of FIG. 1B.
Figure 1D:
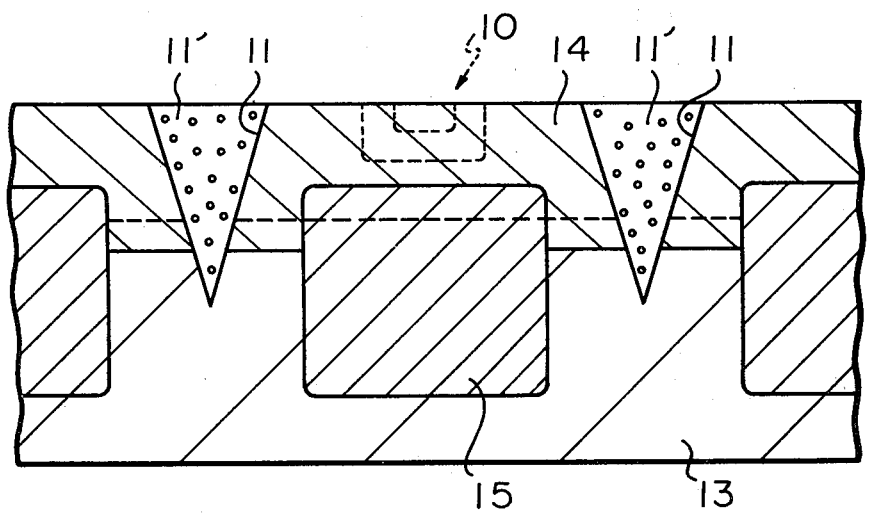
Figure 1E:
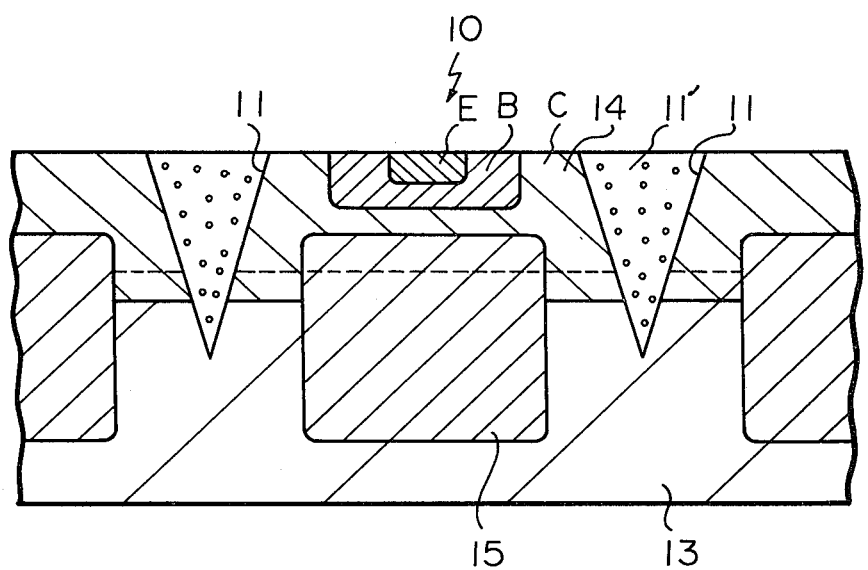

However, a look at a cross-sectional view gives a slightly different perspective. FIGS. 1C, 1D, and 1E are cross-sectional views taken along the lines 1C—1C, 1D—1D, and 1E—1E of FIG. 1B, respectively. In FIG. 1C, reference numerals 11 and 12 represent the first and second passive isolation grooves of the isolation regions, respectively. These grooves 11 and 12 enclose each semiconductor device 10, illustrated by dotted lines, formed above a substrate 13. On the substrate 13, an epitaxial layer 14 is formed. The buried layer 15 of dense impurities, i.e., high conductivity is formed in a belt in both the substrate 13 and the epitaxial layer 14. The epitaxial layer 14 is not wholly shown in FIG. 1C. It is wholly shown in FIGS. 1D and 1E.

It is preferable to fill the V-shaped grooves 11 and 12 with filling material to create a smooth surface of the semiconductor substrate. The paddings are referenced by numerals 11' and 12' for the V-grooves 11 and 12, respectively, and can be made of, for example, polycrystalline silicon. These form the passive isolation regions.

The semiconductor element 10 is fabricated in the epitaxial layer 14 and, at the same time, above the buried layer 15. The first passive isolation groove 11 extends parallel to the buried layer 15 and reaches deeply through the epitaxial layer 14 to penetrate into the base substrate 13. On the other hand, the second passive isolation groove 12 extends in a direction perpendicular to the direction of the buried layer 15 and reaches shallowly through the epitaxial layer 14 to extend to the upper surface of the buried layer 15. However, in practice, the groove 12 does not often penetrate into the buried layer 15, thereby leaving a gap therebetween. FIG. 1C shows a case of such an undesired gap G. The epitaxial layer 14 is seen via the gap G in FIG. 1C. The reason for the formation of this gap G is believed to be the excessive thickness of the epitaxial layer 14 or excessive shallowness of the second passive isolation groove 12, in relation to design values, due to manufacturing variations.

By way of reference, the first and second passive isolation grooves 11 and 12 are preferably formed by an anisotropic etching process. The anisotropy is defined as having a lattice constant of <1, 0, 0>. In this process, the depth of the isolation grooves is determined proportionally by the width of the opening thereof.

If gap G is created, electric charges move unavoidably between adjacent semiconductor elements 10 through the gap G, thereby inducing the formation of parasitic thyristors and the resultant latchup.

Formation of gap G could be prevented by decisively increasing the depth of the second isolation groove 12, however, this would cause the isolation groove 12 to separate the buried layer 15 into divisions and cause the buried layer 15, implanted for the purpose of reducing the resistance of the substrate to have a high resistance. In addition, increasing the depth of the second isolation groove 12 would, in the <1, 0, 0> anistropic etching process, means increasing the width of the opening W (refer to FIG. 1B), preventing the semiconductor circuit from being highly integrated.

In the present invention, an additional passive isolation groove is formed at the end portion of the second passive isolation groove 12 wherever the first and second passive isolation grooves 11 and 12 merge. Such formation of an additional third passive isolation groove is easily achieved by the <1, 0, 0> anisotropic etching process.

Figure 2A:
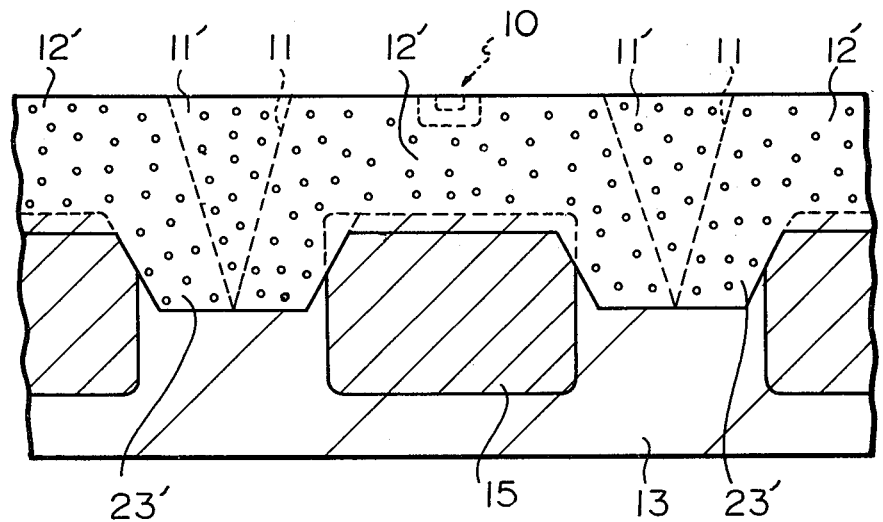
FIG. 2A is a cross-sectional view of the semiconductor device according to the present invention taken along the lines corresponding to the lines 1C—1C of FIG. 1B.
Figure 2B:
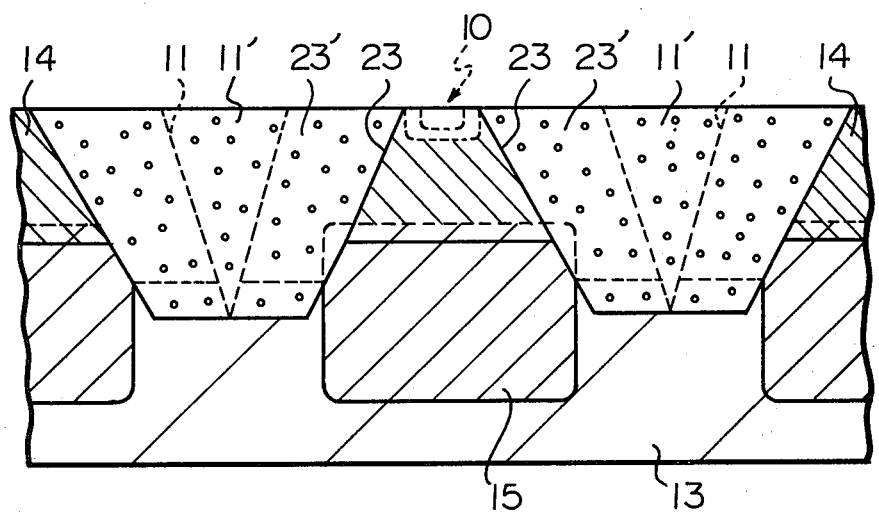
FIG. 2B is a cross-sectional view of the semiconductor device according to the present invention taken along the lines corresponding to the lines 1D—1D of FIG. 1B.

FIG. 2A is a cross-sectional view of the semiconductor device according to the present invention taken along the lines corresponding to the lines 1C—1C of FIG. 1B. FIG. 2B is a cross-sectional view of the semiconductor device according to the present invention taken along the lines corresponding to the lines 1D—1D of FIG. 1B.

As can be understood from FIGS. 2A and 2B, gap G (refer to FIG. 1C) is replaced by the additional passive isolation groove 23. Paddings 23' filled in the groove 23 illustrated in both FIGS. 2A and 2B, are made of, for example, polycrystalline silicon. Due to the presence of the groove 23 instead of the gap G, electric charges can no longer communicate between two adjacent semiconductor elements 10. Thus, latchup is completely suppressed. The additional passive isolation groove 23 is formed in such a manner as to, first, overlap a part of the second passive isolation groove 12, second, to be deeper than the second passive isolation groove 12, and, third, to be formed with a V shape, in cross-section, both sides of which partially cut off each upper edge of the buried layers 15 adjacent thereto, and cut into the adjacent first passive isolation groove 11.

The above-mentioned additional isolation groove 23 can easily be formed with the anisotropic etching process by suitably changing the width of the opening of the second passive isolation groove 12, as explained hereinafter.

Figure 3:
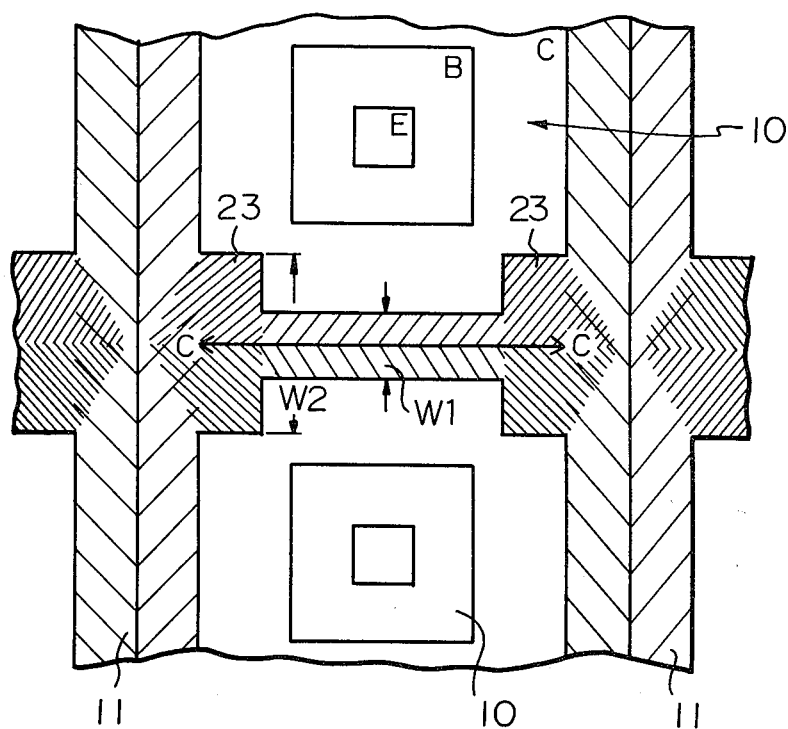
FIG. 3 is a plan view of the semiconductor device according to the present invention, corresponding to the plan view of the prior art semiconductor device shown in FIG. 1B.

FIG. 3 is a plan view of the semiconductor device according to the present invention, corresponding to the plan view of the prior art semiconductor device shown in FIG. 1B. In FIG. 3, the hatched areas represent slopes of the isolation grooves. The newly introduced additional isolation grooves are represented by the reference numeral 23. It is important to note that these additional isolation grooves are obtained merely by modifying the width of the opening of each conventional second groove 12 during the manufacturing process thereof. To be more specific, the width (W2) at the ends of each second groove 12 is set wider than the width (W1) at the center of each second groove 12.

As previously mentioned, generally, in the <1, 0, 0> anisotropic etching method, a V shape is etched into the semiconductor substrate until reaching the depth determined proportionally by the predetermined width of the opening. The etching then stops; in the present invention, however, the additional passive isolation groove 23 cuts also into the first passive isolation groove 11. That is, the V shape is etched not only vertically, but also horizontally in the direction along arrow C shown in FIG. 3. This means that gap G (FIG. 1C) can be completely prevented. The reason for the V shape being etched in the direction along arrow C is simply that the opening of the third passive isolation groove 23 suddenly increases in width W2 where it merges with groove 11, i.e., the width W2 suddenly becomes equal to the length of the groove 11.

Figure 4:
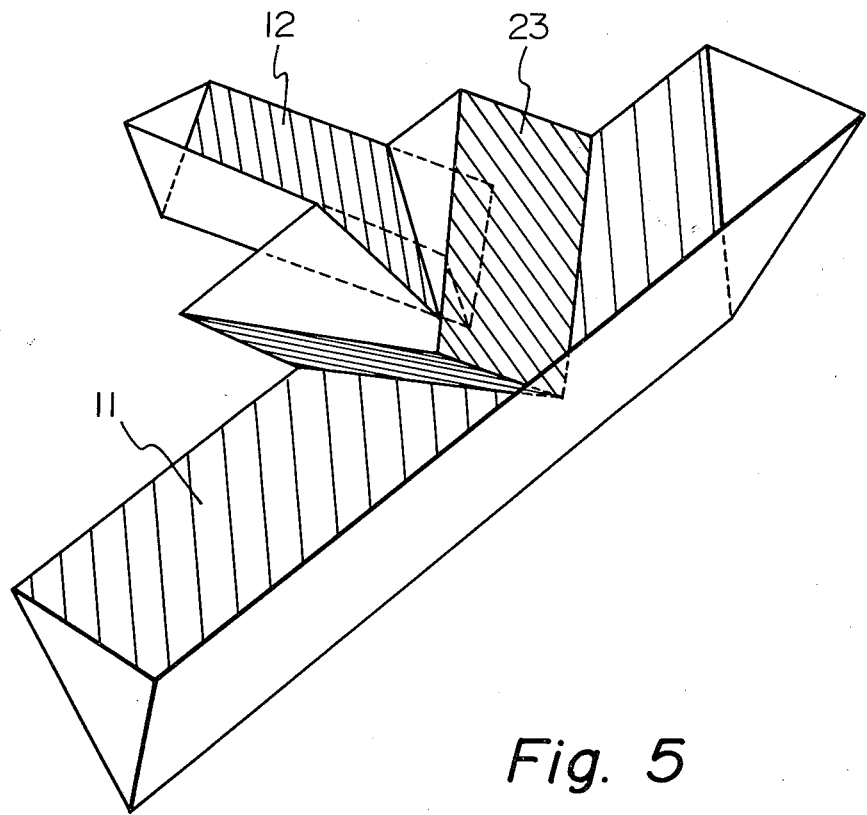
FIG. 4 is a perspective view showing only the passive isolation grooves.

The structure of the additional passive isolation groove can be further clarified with reference to FIG. 4. FIG. 4 is a perspective view illustrating only the passive isolation grooves. That is, FIG. 4 schematically illustrates the first, second, and additional passive isolation grooves 11, 12 and 23, respectively as a perspective view.

Figure 5:
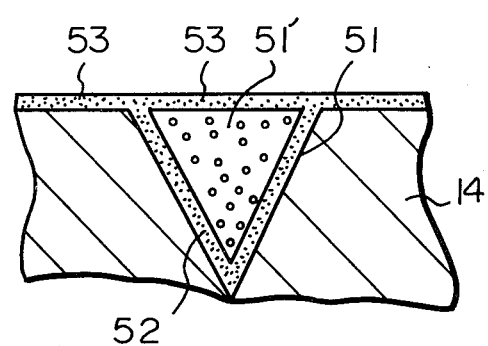
FIG. 5 is a detailed cross-sectional view of a filled passive isolation groove.

In practice, the first, second, and additional passive isolation grooves are filled with filling material respectively 11', 12' and 23' (refer to FIGS. 2A and 2B) to make the surface of the semiconductor substrate flat and smooth and thus form the passive isolation regions. FIG. 5 is a detailed cross-sectional view of a filled passive isolation grooves. Groove 51 stands for any of the aforesaid grooves 11, 12 or 23. Padding 51' stands for any of the aforesaid paddings 11', 12' or 23', such as polycrystalline silicon. Usually, since polycrystalline silicon does have conductivity, though very small, the groove 51 must be insulated from the filling materials 51' by some insulating member. The insulating member is illustrated as an insulation film (SiO$_2$) 52 made by, for example, a thermal oxidation process. Another insulation film (SiO$_2$) 53 is formed over the entire surface of the semiconductor substrate by, for example a thermal oxidation process.

Figure 6A:
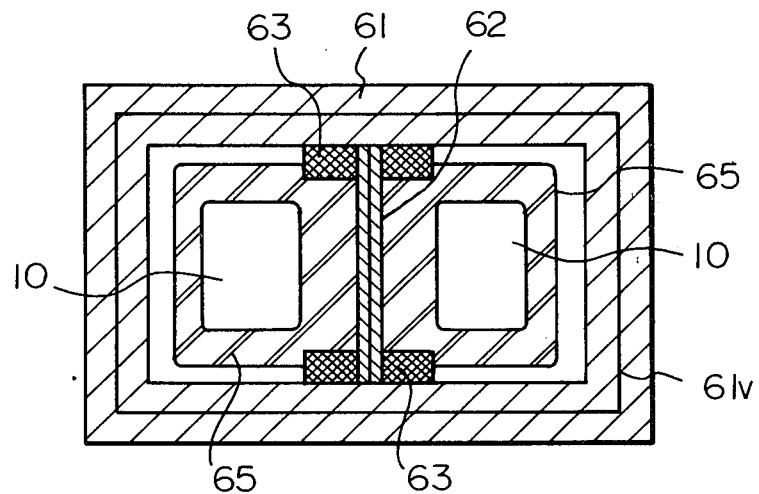
FIG. 6A and 6B are plan views showing, first and second examples of the semiconductor devices, respectively, to which the present invention is adapted.
Figure 6B:
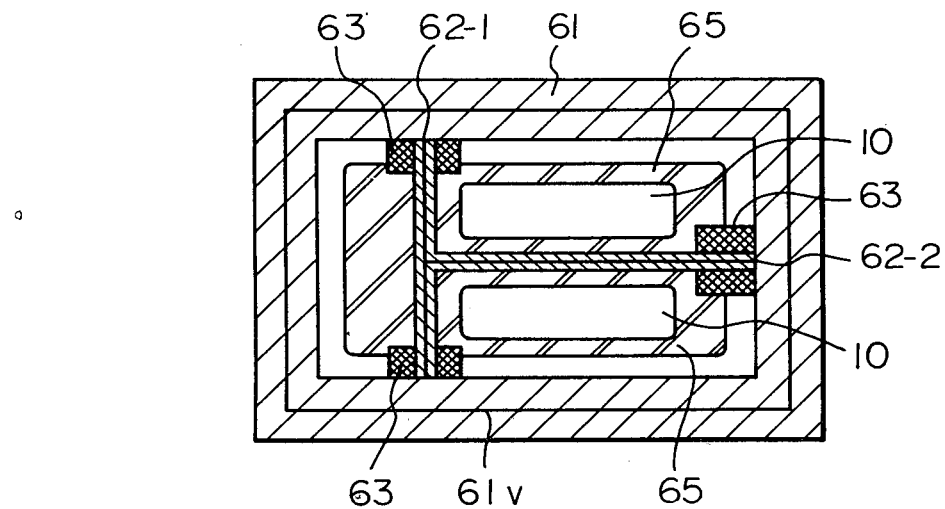

FIGS. 6A and 6B are plan views showing, respectively, first and second examples of semiconductor devices to which the present invention is adapted. It should be understood that in FIGS. 6A and 6B, hatchings are employed not for representing, as usual, cross-sections, but for facilitating the understanding of each area. In these examples, each buried layer is formed not as a belt, as buried layer 15 in FIG. 2A or 2B, but as an island. Accordingly, each semiconductor element 10 is provided with a buried layer 65 as an island thereunder. Further, each first passive isolation groove (corresponding to groove 11 of FIG. 3) is formed not as single line as the previously explained groove 11, but as a doughnut. Each first passive isolation groove of the doughnut is referenced by the numeral 61. The bottom of the first passive isolation groove 61 is referenced by the numeral and symbol 61v. In FIG. 6A, the second passive isolation groove is formed as an I-shaped groove 62. In FIG. 6B, the second passive isolation groove is formed as a T-shaped groove comprised of both grooves 62-1 and 62-2. The third passive isolation grooves according to the present invention are introduced into areas illustrated by double hatchings in FIGS. 6A and 6B and are referenced by the numeral 63.

As explained in detail, according to the present invention, a semiconductor device is obtained which does not permit the creation of latchup.

I claim:

1. A semiconductor device having a plurality of semiconductor elements, comprising:
   a substrate;
   an epitaxial layer formed on said substrate;
   a buried layer of high conductivity, formed inside both said substrate and said epitaxial layer;
   a first passive isolation region formed parallel to said buried layer through said epitaxial layer and penetrating into said substrate;
   a second passive isolation region, having a center portion and end portions, formed perpendicular to said buried layer and said first passive isolation region and penetrating into said buried layer, said second passive isolation region formed in such a manner as to enclose, together with said first passive isolation region, each of the semiconductor elements, said end portions of said second passive isolation region being deeper than said center portion of said second passive isolation region.

2. A semiconductor device as set forth in claim 1, wherein said end portions of said second passive isolation region penetrate into said substrate.

3. A semiconductor device as set forth in claim 1, wherein said first and second passive isolation regions are formed in V-shaped grooves.

4. A semiconductor device as set forth in claim 1, wherein the width of said end portions of said second passive isolation region is wider than that of said center portion.

5. A semiconductor device as set forth in claim 1, wherein each of said first and second passive isolation regions comprises a groove, an insulating film covering said groove, and a polycrystalline layer formed on said insulating film filling each of said grooves.

6. A semiconductor device as set forth in claim 1, wherein each of said first and second passive isolation regions comprise:
   a groove;
   an insulating film covering said groove; and
   a filling material, formed on said insulating film, filling each of said grooves.

7. A semiconductor device having a plurality of semiconductor elements, comprising:
   a substrate;
   an epitaxial layer formed on said substrate;
   a buried layer of high conductivity formed inside both said substrate and said epitaxial layer;
   a first passive isolation groove formed parallel to said buried layer through said epitaxial layer and penetrating said substrate; and
   a second passive isolation grove, having a center portion and end portions which penetrate into said substrate and are wider than said center portion, formed perpendicular to said buried layer and said first passive isolation groove.

8. A semiconductor device as set forth in claim 7, wherein said first passive isolation groove and said second passive isolation groove are formed in such a manner as to enclose each of the semiconductor elements.

9. A semiconductor device as set forth in claim 7, wherein said first and second passive isolation grooves are covered with an insulating film and a filling material is formed on said insulating film filling each of said isolation grooves.

10. A semiconductor device as set forth in claim 7, wherein said buried layer intersects said first passive isolation groove and has an upper edge that is removed by the formation of said second passive isolation groove.

11. A semiconductor device as set forth in claim 7, wherein said first and second passive isolation grooves are V-shaped.

12. A semiconductor device as set forth in claim 9, wherein said filling material comprises a polycrystalline layer.

* * * * *